(12) United States Patent
Brophy et al.

(10) Patent No.: US 6,892,337 B1
(45) Date of Patent: May 10, 2005

(54) CIRCUIT AND METHOD FOR TESTING PHYSICAL LAYER FUNCTIONS OF A COMMUNICATION NETWORK

(75) Inventors: Brenor L. Brophy, San Jose, CA (US); Dinesh Nadavi, Cupertino, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 596 days.

(21) Appl. No.: 09/935,283

(22) Filed: Aug. 22, 2001

(51) Int. Cl.[7] ............................................... G01R 31/28
(52) U.S. Cl. ........................ 714/739; 714/715; 714/716; 375/221; 708/256
(58) Field of Search ................................ 714/739, 715, 714/716; 375/221; 708/256; 700/57; 712/28; 705/1

(56) References Cited

U.S. PATENT DOCUMENTS

| | | | | |
|---|---|---|---|---|
| 4,941,082 A | * | 7/1990 | Pailthorp et al. | ............... 700/57 |
| 5,444,645 A | * | 8/1995 | Yoshida et al. | ............. 708/256 |
| 6,094,532 A | * | 7/2000 | Acton et al. | .................... 712/28 |
| 6,201,829 B1 | * | 3/2001 | Schneider | .................... 375/221 |
| 2002/0147611 A1 | * | 10/2002 | Greene et al. | .................. 705/1 |

OTHER PUBLICATIONS

National Semiconductor Corp., "SCAN921023 and SCAN921224 20–66 MHz 10 Bit Bus LVDS Serializer and Deserializer with IEEE 1149.1 (JTAG) and at–speed BIST," Feb. 2001, pp. 1–20.

\* cited by examiner

*Primary Examiner*—Albert Decady
*Assistant Examiner*—Dipakkumar Gandhi
(74) *Attorney, Agent, or Firm*—Kevin L. Daffer; Daffer McDaniel LLP

(57) ABSTRACT

A system is provided for testing a physical layer device, or various network portions connected to that physical layer device. The test system includes a random bit generator that, during use, produces a random pattern of bits clocked in parallel onto the transmit portion of the physical device. The parallel-fed information can then be serialized and selectably fed back to the receive input of the same physical device. The receive portion of the physical device can then deserialize the random pattern of bits, and present those bits to logic within the test system. The test system can, therefore, compare each of the random pattern of bits presented to the physical device with corresponding bits derived from the deserializer. If each bit within the random pattern of m bits forwarded to the serializer does not compare with each corresponding m bits forwarded from the deserializer, then the physical device is known to be a failure. Instructions which begin and end the test operation are forwarded from a test device that is linked to the test system by a JTAG access port configured according to IEEE Std. 1149.1. This allows non-proprietary instructions to be sent into the access port controller, using only a single input pin among the four-pin JTAG access port, where a decoder within the test system is programmed to decode that instruction and either begin or end the test operation. A clock generation circuit will generate a high speed clock, for use by the physical device, to allow the physical device to operate at speed without requiring a costly test system to generate a high-speed clock and signals proprietary to that test system.

22 Claims, 3 Drawing Sheets

CIRCUIT AND METHOD FOR TESTING PHYSICAL LAYER FUNCTIONS OF A COMMUNICATION NETWORK

BACKGROUND OF THE INVENTION

1. Field of the Invention

This invention relates to a system for testing the open system interconnect ("OSI") protocol suit applicable to components that form the physical layer of the OSI model. Instructions within non-proprietary test languages can be sent into a non-proprietary test access port ("TAP") such as that described in IEEE Std. 1149.1, for testing the serializer and deserializer functions of the physical layer interface at the normal operating speed at which the serial data stream is produced from the serializer and received by the deserializer.

2. Description of the Related Art

The following descriptions and examples are not admitted to be prior art by virtue of their inclusion within this section.

A communication network typically includes two or more devices which can communicate with each other. The devices are ones which can send digital data. Included with such information are data files, programs, images, etc. An example of such a device may be a network switch. Network switches distribute data across the network, regardless of whether the network is a local area network or a wide area network.

There are numerous ways in which a network switch can interface with the network. The OSI protocol suite attempts to describe the numerous protocols that are employed within the various layers of the OSI reference model. The OSI model is known to include seven layers, where the lowest layer known as the physical layer includes the various protocols and hardware needed to interface a device, such as a network switch, to the other hardware elements which form the network. The physical layer thereby assists in describing the various ways in which a network switch can link to dissimilar network conductors. For example, the network conductor can be coaxial cable, typically found in an Ethernet environment; optical fiber, typically found in fiber-distributed data interface (FDDI); or the well-known token ring and X.25 environments. Each type of link within the network can be designed to receive its own specific protocol. For example, the well-known IEEE 802.3 represents the Ethernet protocol for sending information across an Ethernet coaxial cable.

The physical layer, therefore, represents an interface or "bridge" between a bus to the internal switch circuitry of a network switch and the network transmission line (e.g., optical fiber, coaxial cable, wireless, twisted pair, etc.). In order to interface a bus containing data (e.g., a local bus) of the network switch to, for example, a coaxial cable destined to transfer Ethernet protocols, the physical layer interface must be capable of transferring parallel-fed information on the bus to serialized information on the network during a transmit operation, and to receive serial information from the network and present parallel-fed information back to the bus during a receive operation. Moreover, the physical link layer must also be capable of operating at the relatively low transfer rate of the bus and the much higher transfer rate of the network cable, fiber, etc.

The physical layer used to bring about a proper interface is typically contained on a network interface card or a line card. Each network switch has one or more line cards that can be connected to, for example, the network switch motherboard as well as the network link. In some instances, the entire physical layer function of bridging parallel and serial data operating at dissimilar clock speeds can be performed on a single integrated circuit. A popular such circuit includes products available from Cypress Semiconductor Corp., such as CYP15G0402DX and CYS25G0101DX.

While physical devices are, in general, somewhat comprehensive in their functionality, their ability to perform self-test operations of interface functionality is also fairly limited. A problem exists in that the physical device must operate between the range of the network switch bus and the extremely fast transition speeds of, for example, signals sent across an optical fiber. The physical device can, for example, be a single-chip synchronous optical network (SONET) that transfers information according to asynchronous transfer mode (ATM) protocol at transfer rates exceeding 1 GHz. The ATM cells are sent across the physical medium, such as OC-48 optical fiber. OC-48 formats data into a frame 16 pages deep at a transfer rate of 2.488 Gbits/sec. If the bus to which the physical device is connected is a 16-bit parallel bus, then the differences in transfer rate between the bus and the OC-48 optical fiber is 155.5 (i.e., 2.488 Gbits/sec./16) Mbits/sec. and 2.488 Gbits/sec. The relatively large disparity makes testing of the serializer and deserializer functions within the physical device difficult. Only highly sophisticated and very expensive automated test equipment (ATE) can attain test speeds exceeding 1 GHz, and even fewer can attain speeds exceeding 2.4 GHz.

As more and more physical layer devices are integrated, fewer of such devices output their controls to pins on the physical device. Accordingly, even if a high speed ATE system can be deployed, such a system would not be able to send and receive information into the internal control conductors of the physical layer device. For example, many physical layer devices can be deployed as a programmable logic device (PLD). Unlike application specific integrated circuits (ASIC), PLDs embed their functionality and control within a universally programmable circuit that is not easily accessible (for high speed test) outside that circuit. It would, therefore, be desirable to implement a test circuit within the confines of the PLD that can be enabled using a non-proprietary access port. It would be further desirable that the on-board test circuit be able to test physical device functionality at the high speeds attributable to, for example, OC-48 without requiring expensive proprietary ATEs.

SUMMARY OF THE INVENTION

The problems outlined above are in large part solved by a on-board test system that can test the functionality of the physical layer device. The test system is purposely designed to operate the device at the targeted speed of the network. In other words, the test system can test the serializer and deserializer of the physical layer device by serializing a test pattern at clock rates exceeding 2.4 GHz and, after looping that signal back to a deserializer, deserializing the high speed serial bitstream and comparing the resultant bitstream with the random bitstream forwarded to the serializer. In this fashion, the serializer and deserializer circuits within the physical device can be tested at the full operating speed of that device. Conventional testers often require an all 0s or all 1s bit pattern be serialized, deserialized, and tested. Unfortunately, this type of test is not only non-robust, but also cannot test a fuller pattern of bits that would normally be presented to the serializer and deserializer during its operation.

In order to operate the physical device at speed, a first clock must be generated somewhere upon or near the physical device. For example, a clock generator can be used to generate, e.g., a 155.5 MHz clock. That clock can then be presented to the physical device to synchronously receive in parallel a set of n bits. A PLL within the serializer circuit of the physical device will then multiply the first clock by the number of bits that the serializer is receiving, in order to generate the high speed serial clock which, in this example, is 155.5n MHz, and if n=16, then the serial bitstream transitions at a rate of 2.488 GHz.

A pair of relays is preferably coupled between the transmit output port of the physical device and the receive input port of the physical device. Those relays either connect or disconnect the differential serial bitstream output from the transmit port and input into the receive port. If connected, the relays effectuate a loop-back conductor between the transmit output port and the receive input port of the physical device. This allows not only the transmit circuitry to operate at speed, but also the receive circuitry.

Contained within the receive circuitry is another PLL that divides the clock speed of the incoming serial bitstream by n, and presents parallel-fed bits back to the test system. The test system thereby can compare those parallel-fed bits with the original pattern of bits presented to the transmit circuitry of the physical device. Identical pattern generators on the transmit and receive side can be synchronized so that the first bit pattern of m bits transmitted to the physical device can be compared with the same bit pattern received from the deserializer, and if every bit position has a matching value, then the physical device will have passed the functional testing carried out by the test system.

A standard non-proprietary interface can be used to send instructions to the test system. Preferably, that interface is the well-known test access port (TAP), alternatively referred to as a JTAG access port described in IEEE Std. 1149.1. If the test system and the physical device are embodied upon a single integrated circuit such as a PLD, then it would be rather convenient to reserve four pins on the PLD as the pins attributable to the JTAG access port. Any instructions sent into the TDI pin of the JTAG port would, therefore, be compatible with the IEEE Std. 1149.1, and controllable under the JTAG-compatible TCK and TMS signals. Non-proprietary instructions can then be written and stored within a host computer. Those instructions are operably used to initiate or terminate testing of the physical device by the test system.

According to one embodiment, the test system can include a pseudo-random bit generator adapted to produce a pseudo-random pattern of bits. The bits can be clocked in parallel onto n conductors at a first rate. Also included with the test system is logic which can compare each of the random pattern of bits with each of the random pattern of bits after having been converted to a serial bitstream clocked at a second rate equal to n times the first rate. The logic associated with the test system can include a frame compare circuit that gathers a group of frames consisting of m bits from the serial bitstream. The logic can also include a comparator which compares each bit of the frame of m bits to respective bits within the random pattern of m bits before the random pattern of m bits has been converted to the serial bitstream. The comparator, therefore, compares the logic value of the first bit within the first random pattern of bits with a corresponding first bit within a first of the random pattern of bits after having been converted to a serial bitstream. Thereafter, the comparator compares the logic value of the second bit within the first random pattern of bits to a second bit within the first random pattern of bits after having been converted to a serial bitstream. This process of comparing corresponding bits within the first pattern of bits is continued for the next pattern of bits, and so on so that each bit within each of the multiple pattern of bits can be compared. If the comparator notes a dissimilarity between logic values of one or more corresponding bits, then a fail flag will be set. This flag may then be read by the host computer through the test access port. The host computer will, therefore, note that for a given instruction to begin the self test by the test system, a failure resulted. A user can, therefore, discern that the physical device is defective and prevent the same from being sent to a customer.

According to yet another embodiment, a self-test circuit is provided. The self-test circuit includes not only the test system, but also the physical device being tested by the test system. Included with the self-test circuit is a memory for storing a random pattern of m bits. A serializer operably connected to the memory is coupled to receive the random pattern of m bits clocked in parallel upon n conductors at a first rate. Output from the serializer is a serial bitstream clocked at n times the first rate. A deserializer thereby receives the serial bitstream through a loop-back conductor selectably connected between the serializer and the deserializer. A comparator then receives frames of m bits from the deserializer and compares each bit of the m bits within each frame from the deserializer to corresponding bits of the random pattern of m bits stored within the memory. The comparison function will thereby test functional operation of the serializer and deserializer and, importantly, test the physical device at speed.

BRIEF DESCRIPTION OF THE DRAWINGS

Other objects and advantages of the invention will become apparent upon reading the following detailed description and upon reference to the accompanying drawings in which.

DETAILED DESCRIPTION OF PREFERRED EMBODIMENTS

Figure 1:
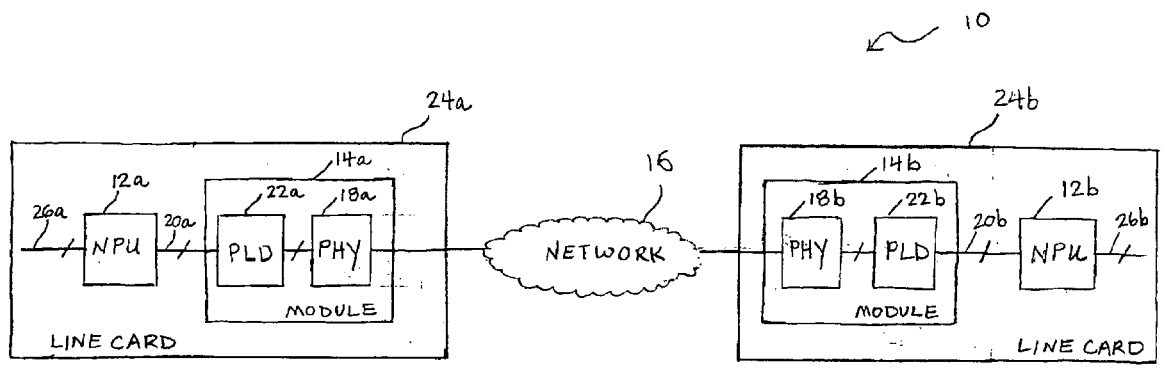
FIG. 1 is a block diagram of a pair of network interface cards that connect respective host computers to a communication network.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Turning now to the drawings, FIG. 1 illustrates a typical application for a physical layer device (PHY), a communication system 10, shown to interconnect two or more network processor units (NPU) 12 each mounted on network line cards 24. Depending on their application, network processor units 12 can comprise part of a network switch that can send and receive information, such as data, programs, images, audio, video, etc. In order to connect data on one or more buses of NPU 12a to a corresponding bus of NPU 12b, each can have a PHY Module 14. Module 14 can be an interconnected set of integrated circuits placed on a printed circuit board, or daughterboard or, alternatively, module 14 can have the various circuits integrated upon a single monolithic silicon substrate. Regardless of its configuration, module 14 is connected to its respective NPU.

Depending on the type of network 16 being deployed, and the bus to which module 14 is operably connected, the circuitry within module 14 is adaptable. Most networks extend over rather long distances and, if connected through a wire (e.g., copper or optical fiber), module 14 must deploy physical layer devices 18 that can communicate between the serial data placed on network 16 and the slower parallel data on bus 20 of NPU 12. Physical layer device 18, therefore, includes any device that can interface between a bus 20 and network 16. Generally speaking, physical layer device 18 must operate at dissimilar clocking speeds to accommodate the higher bit-rate transfers across network 16 and the slower bit-rate transfers on bus 20 and, furthermore, physical layer device 18 preferably includes a serializer/deserializer (SERDES) that converts between the parallel-fed information in bus 20 and the serial bitstream of network 16.

Also included with module 14 is a test system. The test system is preferably deployed in a PLD 22. The test system preferably instantiated in PLD 22 can also encompass physical layer device 18. Thus, the test system can be built into the physical layer device, where both are integrated upon a common monolithic substrate. Module 14 is any card which can integrate a built-in self-test system into a physical layer device having a serialization/deserialization function. Accordingly, network 16 is any communication network across which information can flow in a serialized fashion. Preferably, the transfer rate of information across network 16 exceeds one GHz and, therefore, network 16 includes the high speed Ethernet protocol, wireless spread spectrum protocol based on, for example, IEEE Std. 802.11 access points, or the various protocols applicable to optical fibers, such as SONET and ATM.

Figure 2:
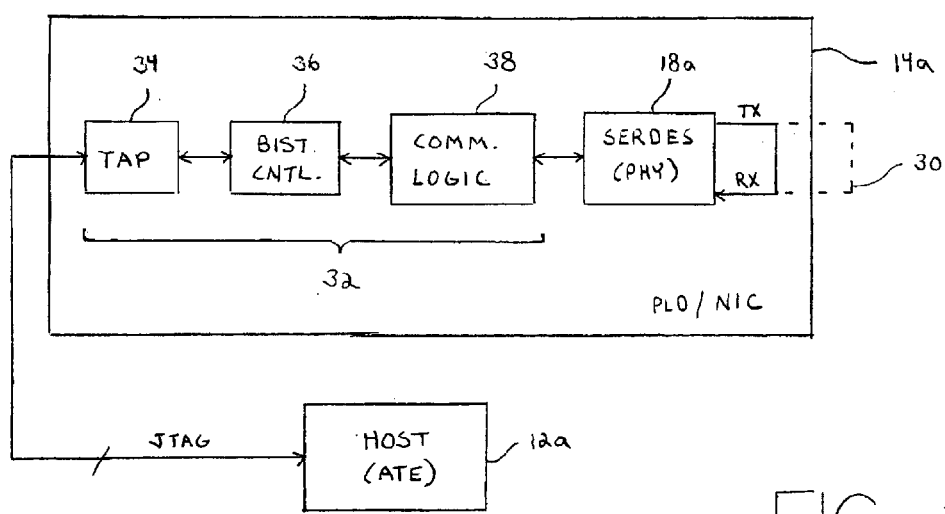
FIG. 2 is a block diagram of the network interface card (or single chip PLD) having an access port for receiving JTAG compliant instructions for controlling on-board or on-chip test logic to functionally test operation of a physical layer interface.

Turning now to FIG. 2, a block diagram of module 14a is shown configured in a test configuration, including a loop-back arrangement. Instead of transmitting information into the network, card 14a may include a local loop-back conductor that selectably couples the transmit output (TX) to the receive input (RX). The selectable loop-back connection can be made on the card itself through relays, or can occur outside the card, possibly somewhere else within the network or another network card such as, for example, card 14b. In this fashion, the test system within card 14a can test the physical device 18a or, if loop-back occurs within another network interface card, the test system can test at least a portion of the network. Loop-back connection outside of card 14a is shown in phantom and identified as reference numeral 30. A Host or piece of Automatic Test Equipment 12 interfaces to module 14 through a parallel JTAG compliant interface. This host could be the NPU within a functioning piece of network equipment or a standalone piece of equipment used to test the module during manufacture.

The test system 32 is preferably built into physical device 18 either upon the same card or as a single programmable logic device. Included with test system 32 is a test access port or "access port" 34, a built-in self-test controller 36, and communication logic 38. Access port 34 includes a controller, one or more instruction registers, one or more instruction decoders, a shift register, and a multiplexer, each of which are well documented in IEEE Std. 1149.1. Accordingly, access port 34 is a four-pin access point that receives serialized data across TDI pin from host 12a, delivers output from TDO output pin to host 12a, and receives a clock and mode select signal (TCK and TMS) from host 12a. The combination of TDI, TDO, TCK, and TMS are represented as JTAG signals, shown in FIG. 2, and further described in FIG. 3 herein below. BIST controller 36 is any controller which can decode instructions sent from the shift register of access port 34, and which responds by enabling communication logic 38. BIST controller 36 is, therefore, an instruction decoder that receives the instruction from the TDI pin as a parallel-driven opcode recognizable to controller 36. Depending on the opcode being sent, BIST controller 36 will either begin the test operation or terminate the test operation and communication logic 38 responds accordingly. Other opcodes may be used to select various functional modes of the PHY 18.

Figure 3:
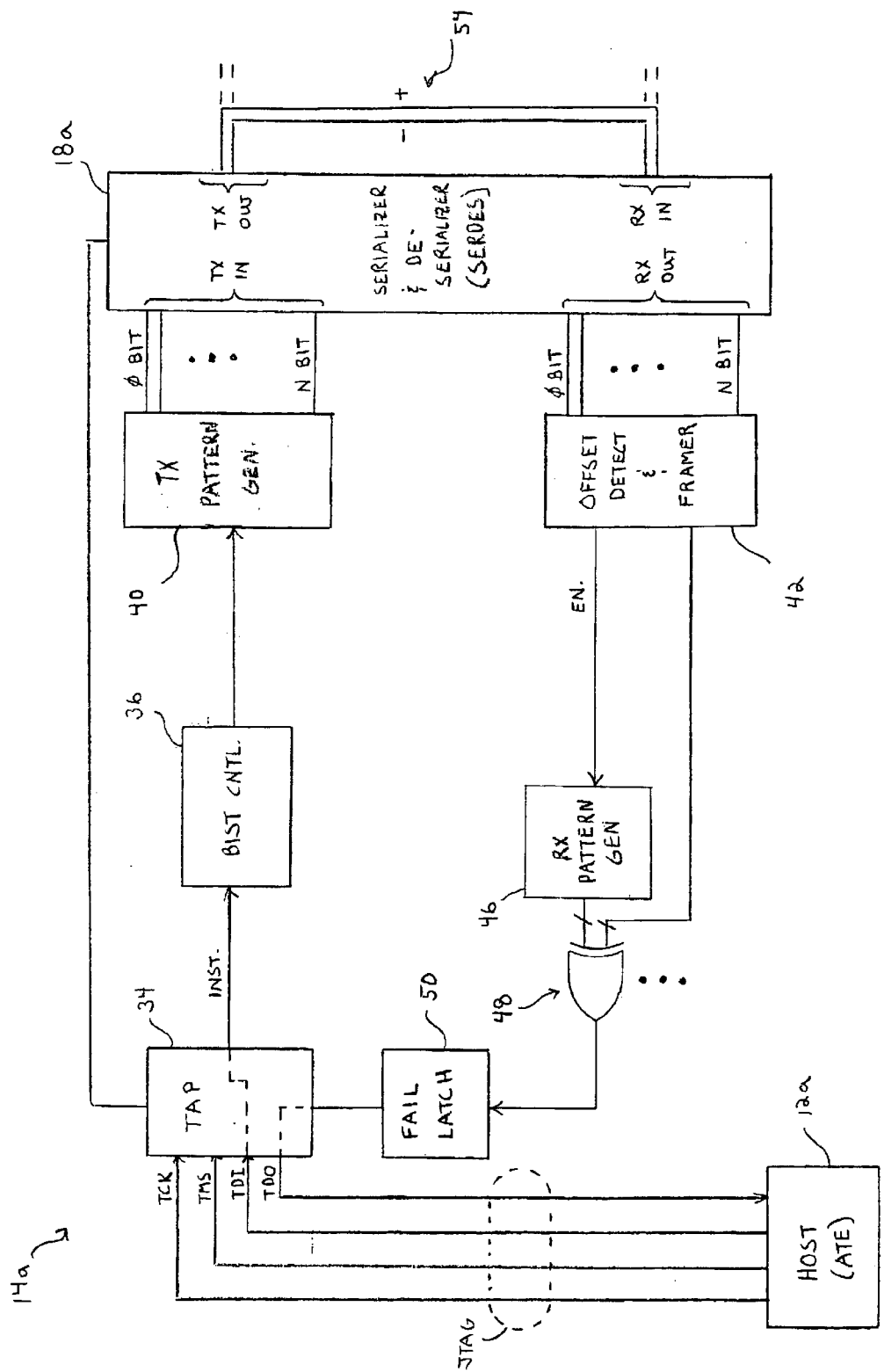
FIG. 3 is a more detailed block diagram of the on-board test logic of FIG. 2.

Turning now to FIG. 3, a block diagram of card 14a is shown in more detail. Specifically, FIG. 3 illustrates the various subcomponents of communication logic 38 (of FIG. 2) as including pattern generator 40, offset detect and framer 42, shift register 46, compare logic 48, and latch 50. Upon generating an instruction by host 12a, the instruction is sent into the TDI pin of access port 34. That instruction is then forwarded to controller 36. Controller 36 will decode that instruction and, depending on the decode operation, instruct generator 40 to produce a pattern of bits or not produce a pattern of bits. If testing is to begin, the JTAG instruction might be a RUN BIST instruction. If testing is to end, the JTAG instruction may be a STOP BIST. Regardless of the instruction, BIST controller 36 recognizes it to either begin the test sequence or terminate the test sequence.

If testing is to begin, pattern generator 40 will be enabled to generate a pseudo-random pattern of m bits wide. The number of m bits is dependent somewhat on the frame or cell size of bits that are to be transferred across the network depending on the configuration of the physical layer device 18a.

Bits 0 through n (e.g., n can equal m) are presented to the transmit input port of physical device 18a. A transmit circuit, therefore, is included within device 18a, and such circuit receives the parallel-fed bits and serializes those bits as a serial bitstream and complementary serial bitstream from the transmit output port of the transmit circuit. The transmit circuit suffices not only to serialize parallel-fed information, but also accommodates the dissimilar operation speeds at which the parallel bits arrive on the transmit input and the serial bits are sent on the transmit output. If, for example, m=16 and the 16 bits are sent into the transmit input at 155.5 MHz, then the transmit circuit includes a phase-locked loop (PLL) that receives a clock fed into device 18a, and multiplies that clock by 16 to synchronize the serial bitstream at 155.5 MHz×16, or 2.488 GHz. The 2.488 GHz is advantageously compatible with the OC-48 physical interface requirements. The serial bitstream can then be forwarded to the network or, alternatively, connected back to the receive input of physical device 18a. The loop-back of the transmit output to the receive input only occurs during a test mode. BIST controller 36 will, therefore, forward control signals to a relay that connects the loop-back link whenever the BIST controller receives a RUN BIST instruction. The loop-back link 54 will, therefore, transfer the serial bitstream into the receive input where the deserializer will shift the serial input onto corresponding conductors through the receive output port. Thus, physical device 18a includes a receive circuit having a deserializer and a PLL that will divide down the incoming clock signal recovered from the serial bitstream into a slower clock signal on which m bits are forwarded in parallel into offset detector and framer 42. The amount by which the PLL will divide the incoming serial bitstream is dependent on the value m. Accordingly, the PLL within the transmit circuit and the PLL within the receive circuit include divide-by and multiply-by counters in the feed-back loop of each respective PLL.

This significance of offset detect/framer 42 indicates that the serial bitstream transmitted across the loop-back link 54 is placed in one or more frames. The mechanism by which the serial data is framed is dependent on the protocol being used to frame that data. The frames of data must be thereafter aligned or "framed" to match up the parallel data word received by framer 42 from the receive circuit of physical device 18a with the data word sent to the transmit circuit of physical device 18a. This framing is done in two stages. First, the bit-offset of a framing character is detected. This framing character is generally the value of the first data words sent from the transmit circuit. Once the bit-offset has been detected, framer 42 selects the correct set of bits to align the output data. Thus, subsystem 42 will detect the offset bit and, based on that offset bit, align bits within one or more frames sent across link 54 to corresponding bits sent into the transmit circuit. Once offset is detected and the framer has gathered the attributed bits, an enable signal (EN) is sent to pattern generator 46. Similar to the pattern generator within subsystem 40, pattern generator 46 will present the same bit pattern being presented to the transmit input port of device 18a into corresponding inputs of a multiplicity of exclusive OR gates which forms a comparator 48. Thus, each bit of m bits within the randomly generated pattern being presented to the transmit input of device 18a is compared with a corresponding bit sent from framer 42. If, for example, the m number of bits that are randomly generated is equal to 32, then framer 42 will note the location of those 32 bits and present those bits in the same sequence in which the 32 bits are presented into the transmit input port using, in this example, two clock cycles if the parallel input pins equal 16. Framer 42 will present 16 bits at a time, using two clock cycles, and comparator 48 will compare corresponding 16 pairs of bits over two clock cycles to formulate a full "framed" compare of each bit within the m pattern of bits. If the bits favorably compare (i.e., are at the same logic level), then fail latch 50 will set an appropriate output bit in a register that may be read back through the TDO pin. Fail latch 50 is a NAND latch whose input is connected to an OR gate that is tied to all of the exclusive OR outputs which form comparator 48. The status of fail flag bit will inform the host 12a on whether physical device 18a passed or failed the self-test operation. Comparator 48 thereby compares the output from framer 42 and the pattern generator output sent to the receive circuit on a bit-by-bit basis. Any differences whatsoever in any of the bits within the pattern of bits being compared, will be indicative of a failure that will set the NAND latch circuit output as a failure, as thereafter noted across TDO pin.

During the test operation, the ATE or host 12a loads the test system embodied upon a PLD with the configuration data that implements self-test operation. The ATE or host 12a may also control a BIST clock generator 60, shown in FIG. 4. The BIST clock generator 60 is used to provide one or more clock inputs to the PHY. The ATE may use the BIST controller 36 to place the PHY is internal loopback mode, or may directly control external relays 62 to loopback the PHY TX outputs to the PHY RX inputs. The ATE sends the RUN BIST command to the TAP controller within access port 34. After a short time, ATE within host 12a sends the STOP BIST command and then reads back the result of fail latch 50 to determine if the physical device worked correctly or not.

Figure 4:
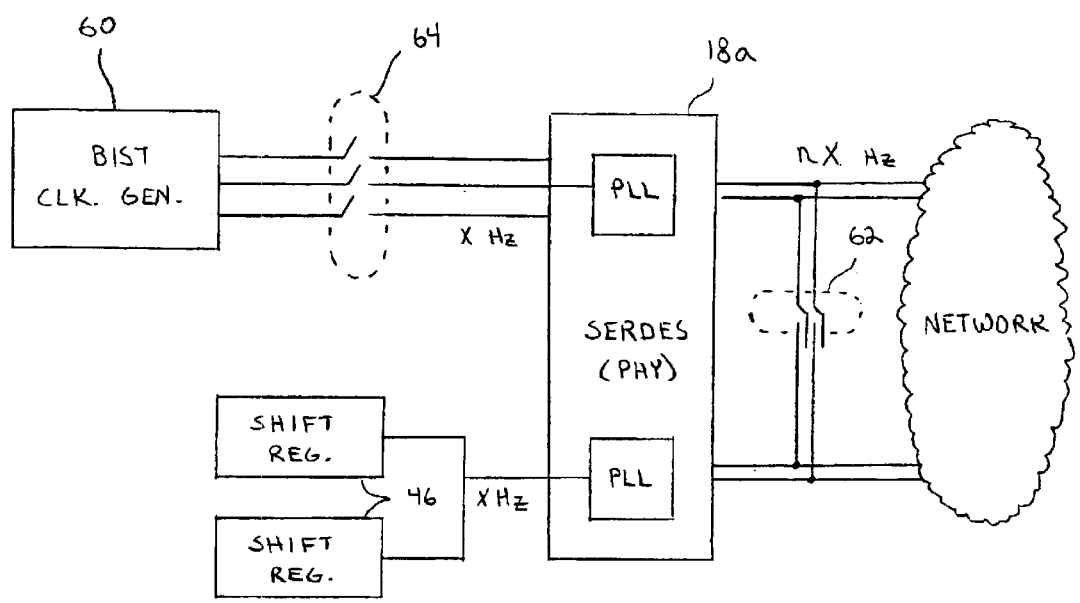
FIG. 4 is a block diagram of a selectable clock distribution system and transmit/receive loop-back configuration employed within the network interface card or PLD of FIGS. 2 and 3.

The BIST clock generator 60 of FIG. 4 is preferably mounted in close proximity to the module under test. Clock generator 60 provides high frequency clock signals needed to run physical device 18a at speed. For example, the OC-48 physical device obtainable from Cypress Semiconductor Corp. as part no. CYS25G0101 is incorporated into Cypress Semiconductor Corp. device CYP25G01K100, and requires a clock of 155.5 MHz. Switches 64 can be electrically controlled to connect a selected clock signal from among possibly numerous clock signals that can be generated by generator 60. Switches 64 can be analog switches that can connect and disconnect the clock signals from physical device 18a. For example, one clock signal at 155.5 MHz can be selected by closing the appropriate switch 64, and presenting that clock to the PLL within the transmit circuit of device 18a. The PLL within the transmit circuit can then multiply the incoming clock signal to an appropriate clock signal usable by the serial bitstream. The amount of multiplication is shown to be equivalent to n or, in the case where n equals m, equivalent to m. The clock signal is then recovered by the receive PLL, divided, and presented to pattern generator 46.

Relays 62 are preferably high bandwidth reed relays that provide selectable coupling of the loop-back link from the transmit circuit back to the receive circuit of physical device 18a. The reed relays are preferably those which can connect and disconnect within a clock cycle of the serial bitstream. Accordingly, in an OC-48 environment the clock cycle can transition at speeds exceeding 2.4 GHz, thus, requiring high bandwidth reed relays.

The pattern generator 40 of FIG. 3 is one which produces a pseudo-random pattern of bits. The advantages of using a pseudo-random bit pattern rather than a bit pattern of all 1s or 0s, as in conventional designs, is not only to exercise at speed the serializer and deserializer functions of device 18a, but also to prevent a skewed DC value. If more 1s than 0s are allowed to enter the transmit input port, which are then conveyed onto the transmit output port, the receive input port from the loop-back link will detect an accumulated DC value often known as "baseline wander." Any baseline wander will cause the receiver within the transceiver device 18a to detect an encoded signal which is dependent upon the bit sequence of that signal. Detection is no longer based on an ideal DC-free coding signal, but instead wanders from the baseline or midline voltage value. Avoiding DC accumulation or baseline wander is critical to being able to achieve a more robust testing of the receive portion of the transceiver.

What is claimed is:

1. A system for testing an integrated circuit, comprising:
   a random bit generator adapted to produce a random pattern of bits, at least a portion of which are configured to be clocked in parallel onto n conductors at a first rate; and
   logic adapted to compare each of the random pattern of bits with each of the random pattern of bits after having been converted to a serial bit stream clocked at a second rate equal to n times the first rate.

2. The system as recited in claim 1, wherein the generator produces a random pattern of m bits.

3. The system as recited in claim 2, wherein the logic further comprises:
a frame compile circuit for gathering frames of m bits from the serial bit stream;
a second random bit generator adapted to produce a second random pattern of bits identical to the random pattern of bits; and
a comparator coupled to the frame compile circuit and the second random bit generator to receive the frames of m bits and compare each bit within the frames of m bits to respective bits within the second random pattern of bits.

4. The system as recited in claim 3, further comprising a latch coupled to an output of the comparator for storing a signal indicating failure of a serializer which converts the random pattern of bits to the serial bit stream if each bit of frames of m bits are not at the same logic level as respective m bits of the second random pattern of bits.

5. The system as recited in claim 3, further comprising:
a deserializer which converts the serial bit stream to at least one parallel-delivered set of n bits placed onto another set of n conductors at the second rate divided by n; and
a latch coupled to an output of the comparator for storing a signal indicating failure of the deserializer if each bit of the frames of m bits, after having undergone deserialization, are not at the same logic level as respective m bits of the second random pattern bits.

6. The system as recited in claim 1, further comprising a test access port adapted to receive an instruction compliant with IEEE Std. 1149.1, and to present the instruction to the generator for signaling production of the random pattern of bits.

7. The system as recited in claim 1, wherein the instruction is forwarded from a host computer operating from an application program compatible with IEEE Std. 1149.1.

8. The system as recited in claim 7, wherein the application program comprises the JAM™ Standard Test and Programming Language (STAPL).

9. A self-test circuit, comprising:
a serializer having an input and an output, wherein the input is coupled to receive a random pattern of m bits clocked in parallel upon n conductors at a first rate, and wherein the output is coupled to produce a serial bit stream clocked at n times the first rate;
a deserializer coupled to receive the serial bit stream via a loop back conductor selectably connected between the serializer and the deserializer; and
a comparator coupled to receive m bits from the deserializer and to compare each of the m bits from the deserializer to corresponding bits identical to the random pattern of m bits placed on the input of the serializer for testing the serializer and the deserializer.

10. The self-test circuit as recited in claim 9, further comprising:
a clock generator coupled to selectively forward a first clock transitioning at the first rate to the serializer for synchronously receiving the random pattern of m bits; and
a first phase-locked loop coupled to receive the first clock and to multiply the first rate by n to form a second clock transitioning at a second rate for clocking the serial bit stream.

11. The self-test circuit as recited in claim 9, further comprising at least one relay coupled to selectively connect the loop back conductor between the serializer and the deserializer.

12. The self-test circuit as recited in claim 9, wherein the serializer comprises a transmit circuit coupled to accept the random pattern of m bits and transmit the serial bit stream, and wherein the deserializer comprises a receive circuit coupled to receive the serial bit stream and produce a plurality of frames consisting of m bits.

13. The self-test circuit as recited in claim 12, wherein the transmit circuit includes a phase locked loop having a divide-by n counter within a feedback loop of the phase locked loop.

14. The self-test circuit as recited in claim 12, wherein the receive circuit includes a phase locked loop having a multiply-by n counter within a feedback loop of the phase locked loop.

15. The self-test circuit as recited in claim 9, wherein the serializer, the deserializer, and the comparator are interconnected upon a single printed circuit board.

16. The self-test circuit as recited in claim 9, wherein the serializer, the deserializer, and the comparator are interconnected upon a single semiconductor substrate.

17. The self-test circuit as recited in claim 9, wherein at least a portion of the serializer, the deserializer, and the comparator comprise a programmable logic device.

18. The self-test circuit as recited in claim 9, wherein the m bits from the deserializer are arranged in a sequence identical to the m bits clocked in parallel upon the n conductors of the serializer such that the comparator compares the first bit within the sequence from the deserializer with respective bits within the random pattern of m bits.

19. A method for testing a serializer circuit and a deserializer circuit, comprising:
generating a random pattern of bits;
forwarding the random pattern of bits at a first rate;
serializing the random pattern of bits into a serial bit stream at a second rate;
deserializing the random pattern of bits at the first rate;
comparing each bit within the random pattern of bits with respective bits within the deserialized random pattern of bits to determine functional failure of the serializer and deserializer.

20. The method as recited in claim 19, wherein said forwarding the random pattern of bits comprises clocking the bits in parallel upon n conductors at a first rate, and wherein said serializing the random pattern of bits comprises clocking the serial bit stream at a second rate equal to n times the first rate.

21. The method as recited in claim 19, wherein said generating comprises instructing a random bit generator to generate the random pattern of bits using instructions and an access port compatible with IEEE Std. 1149.1.

22. The method as recited in claim 19, wherein said comparing comprises forwarding a signal indicating functional failure status of the serializer and deserializer across an access port compatible with IEEE Std. 1149.1.

* * * * *